United States Patent [19]

Zakaluk et al.

[11] Patent Number: 5,635,414

[45] Date of Patent: Jun. 3, 1997

[54] LOW COST METHOD OF FABRICATING SHALLOW JUNCTION, SCHOTTKY SEMICONDUCTOR DEVICES

[76] Inventors: Gregory Zakaluk, 2425 Aron Dr. N., Seaford, N.Y. 11783; Dennis Garbis, 29 Darby Dr., S. Huntington, N.Y. 11746; Willem Einthoven, 485 Township Lane Rd., Belle Mead, N.J. 08502; Joseph Chan, 27 Robin La., Kings Park, N.Y. 11754; Jack Eng, 2384A Bedford Ave., Bellmore, N.Y. 11710; Jun Wu, 6 Kiowa Ct., Coram, N.Y. 11727; John Amato, 52 Mariners La., Northport, N.Y. 11768

[21] Appl. No.: 409,762

[22] Filed: Mar. 28, 1995

[51] Int. Cl.$^6$ ............................. H01L 21/265
[52] U.S. Cl. ............. 438/471; 438/503; 438/974; 438/799; 117/97
[58] Field of Search .................. 437/39, 225, 226, 437/228, 243, 244, 10, 13, 939, 946; 156/626, 643, 645; 148/DIG. 24, 60

[56] References Cited

U.S. PATENT DOCUMENTS

| | | | |
|---|---|---|---|
| 4,376,657 | 3/1983 | Nagasawa et al. | 148/1.5 |
| 4,711,256 | 12/1987 | Kaiser . | |
| 4,878,988 | 11/1989 | Hall et al. | 156/600 |
| 5,104,828 | 4/1992 | Morimoto et al. . | |
| 5,110,404 | 5/1992 | Fusegawa et al. | 156/603 |
| 5,130,260 | 7/1992 | Suga et al. | 437/11 |
| 5,137,597 | 8/1992 | Curry, II et al. . | |
| 5,190,064 | 3/1993 | Aigo . | |
| 5,201,958 | 4/1993 | Breunsbach et al. . | |
| 5,223,080 | 6/1993 | Ohta et al. . | |
| 5,227,339 | 7/1993 | Kishii . | |
| 5,240,883 | 8/1993 | Abe et al. . | |
| 5,244,819 | 9/1993 | Yue | 437/11 |
| 5,327,007 | 7/1994 | Imura et al. | 257/610 |
| 5,360,509 | 11/1994 | Zakaluk et al. . | |
| 5,389,551 | 2/1995 | Kamakaura et al. | 437/10 |
| 5,419,786 | 5/1995 | Kokawa et al. | 148/33.5 |

FOREIGN PATENT DOCUMENTS

| | | | |
|---|---|---|---|
| 0110783 | 8/1979 | Japan | 437/10 |
| 0013737 | 2/1981 | Japan | 437/10 |
| 0177530 | 11/1982 | Japan | 437/939 |
| 0113860 | 1/1983 | Japan | 437/10 |
| 0159334 | 9/1983 | Japan | 437/10 |
| 0004327 | 1/1987 | Japan | 437/10 |

OTHER PUBLICATIONS

"Flat Grinding of Semiconductor Wafers"—Hinzen; Semiconductors IDR 3, '92.

"A future technology for silicon wafer processing for ULSI"—Abe; Precision Engineering Oct. 1991, pp. 251–255.

"Backgrinding Wafers for Maximum Die Strength"—Lewis; Semiconductor International, Jul. 1992, pp. 86–89.

"Internal gettering heat treatments and oxygen precipitation in epitaxial silicon wafers"—Wijaranakula, Burke and Forbes; Journal of Materials Research, vol. 1, No. 5, Sep./Oct. 1986, pp. 693–697.

"Epi's Leading Edge"—Burggraaf; Semiconductor International, Jun. 1991, pp. 68–71.

"Mirror Surface Grinding of Silicon Wafer with Electrolytic in Process Dressing"—Ohmori and Nakatawa—date unknown.

"Wafer Gettering: The Key to Higher Yields?"—Peter H. Singer, Assoc. Editor, Semiconductor International; Feb. 1983 pp. 67–71.

S.K. Ghandi—"SemiconductorPower Devices", John Wiley & Sons, N.Y., 1977, pp. 290–239 (Chapter 6.3.1).

"Intrinsic Gettering in Heavily Doped Si Substrates for Epitaxial Devices"—Pearce and Rozgony; pp. 53–59.

"Latch–Up and Image Crosstalk Suppression by Internal Gettering"—Anagnostopoulos et al.; IEEE Transactions on Electron Devices, vol. ED–31, No. 2, Feb. 1984, pp. 225–231.

"Defect Engineering as an Important Factor in Developing VLSI Substrates"—Richter et al., 1982; Physics 116B (1983) pp. 162–167 North–Holland Publishing Co.

"Denuded Zone Stability in a SPAD Diode as a Function of Out–Diffusion Parameters"—Poggi et al.; IEEE Transactions of Electronic Devices, vol. ED–34, No. 7, Jul. 1987, pp. 1496–1500.

"Influence of Epi–Substrate Point Defect Properties on Getter Enhanced Silicon Epitaxial Processing for Advance CMOS and Bipolar Technologies"—Borland et al.; pp. 93–106.

"Extrinsic Gettering via Epitaxial Misfit Dislocations: Electrical Characterization"—Salih et al.; Journal of Electrochem. Soc.: Electrochemical Science and Technology, vol. 133, No. 3, Mar. 1986, pp. 475–478.

(List continued on next page.)

*Primary Examiner*—John Niebling
*Assistant Examiner*—Long Pham
*Attorney, Agent, or Firm*—Harold James, Esq.; Robert L. Epstein, Esq.; James & Franklin

[57] ABSTRACT

Significant reduction in the cost of fabrication of shallow junction, Schottky or similar semiconductor devices without sacrifice of functional characteristics, while at the same time achieving the advantages is achieved, after the non-polishing cleaning step is essentially performed, by subjecting the substrate to conditions which move disadvantageous factors within said substrate into a space substantially at said surface, followed by substantially removing said factor-containing space from said substrate chemical removal step, followed etching and vapor deposition steps. Although these new steps add time, and therefore cost, to the overall process, the devices under discussion when produced by known industry processes require yet more time, and involve yet more expense, so that the total process represents a substantial reduction in the cost of their manufacture while producing devices which are the equivalent or superior in electrical performance to such devices which are made by known industry processes.

19 Claims, No Drawings

OTHER PUBLICATIONS

"Denuded Zones in Czochralski Silicon Wafers"—Wang et al.; J. Electrochem. Soc.: Solid-State Science and Technology, vol. 131, No. 8, Aug. 1984, pp. 1948–1952.

"Electrically Active Stacking Faults in Silicon"—Ravi et al.; J. Electrochem. Soc.: Solid State Science and Technology, vol. 120, No. 4, Apr. 1973, pp. 533–541.

"Oxidation–Induced Point Defects in Silicon"—Antoniedis; J. Electrochem. Soc.: Solid State Science and Technology, vol. 129, No. 5, May 1982, pp. 1093–1097.

"Internal Gettering in Czochralski Silicon"—Craven; Semiconductor International, Sep. 1985, pp. 134–139.

"Advanced CMOS Epitaxial Processing for Latch–Up Hardening and Improved Epilayer Quality"—Borland and Deacon; Solid State Technology, Aug. 1984, pp. 123–131.

LOW COST METHOD OF FABRICATING SHALLOW JUNCTION, SCHOTTKY SEMICONDUCTOR DEVICES

BACKGROUND OF THE INVENTION

The present invention relates to a novel method of fabricating shallow junction, Schottky or similar semiconductor devices which is much less costly than prior art methods of producing those devices, yet results in devices functionally the equal of those conventionally produced.

DESCRIPTION OF THE PRIOR ART

U.S. Pat. No. 5,360,509 of Nov. 1, 1994, entitled "Low Cost Method of Fabricating Epitaxial Semiconductor Devices", and assigned to the assignee of this application, discloses and claims a novel method of fabricating epitaxial semiconductor devices on a substrate which, among other things, features treating the substrate surface on which an epitaxial layer is to be grown to a grinding process but not a polishing process before the growing of the epitaxial layer, as a result of which the time involved in forming the devices and the cost thereof are greatly reduced. That process has proved itself to be very effective and valuable in the fabrication of most epitaxial semiconductor devices.

SUMMARY OF THE INVENTION

However, there is a group of semiconductor devices (shallow junction, Schottky or similar devices) which present special fabrication problems, whether subjected to the process of the aforementioned U.S. Pat. No. 5,360,509 or otherwise, because stresses and impurities (hereinafter "disadvantageous factors") in the substrates of those devices exert a particularly deleterious effect on their functioning, and attempts to eliminate or reduce those factors have been exceedingly difficult, frustrating and time consuming.

We have discovered that if the process of the '509 patent is appropriately modified to cause those disadvantageous factors to migrate through the substrate to a space in the substrate substantially at the surface on which the epitaxial growth is to occur, and then to substantially remove that portion of the substrate, after which, preferably, the process of the '509 patent is essentially continued, devices are produced which are functionally equivalent to those produced by present processes but at considerably lowered cost. The process here disclosed does add time and cost to the '509 patent method, but the overall time and expense is considerably less than that required to produce the more specialized semiconductor devices here involved in more conventional manners.

The disadvantageous factors are preferably caused to migrate as described by differentially heating the substrate so that the space adjacent the surface where epitaxial growth is to occur is at an elevated temperature which is nevertheless lower than the remainder of the substrate, and that substrate space then containing the disadvantageous factors is subsequently removed from the substrate, preferably by means of a grinding step which is preferably preceded by a chemical removal of the surface oxide which forms on the said substrate surface as a consequence of the aforementioned heating step.

It is therefore the prime object of the present invention to devise a process for the formation of epitaxial shallow junction, Schottky or similar semiconductor devices on a substrate which will be less time consuming and costly than the prior art methods for forming such devices, yet which will produce devices of equal functional quality when compared to those made by known methods.

DESCRIPTION OF THE PREFERRED EMBODIMENTS

This is accomplished by first carrying out the grinding process of the '509 patent on the surface of the substrate on which epitaxial growth is to occur, as generally described in the paragraph beginning at the bottom of column 1 of the specification of the '509 patent. In a preferred embodiment one may start with an as-cut single crystal silicon wafer and subject the operative surface to a coarse grinding step (60 micron grit) to remove about 1 mil of silicon at a feed rate not to exceed about 1 micron per second, followed by a fine grinding step (6 micron grit) again to remove about 1 mil of silicon at a feed rate not to exceed about 1 micron per second, while the surface being ground is lubricated and cooled, the grinding wheels preferably dwelling at their final position as described in the '509 patent.

In accordance with the present invention the next step is to subject the ground surface to a stress relief and contaminant precipitation annealing step in which the heating and cooling rates are designed to cause disadvantageous factors to travel through the substrate to the vicinity of the previously ground surface. The hallmark of that annealing step is to cause the space in the substrate adjacent that previously ground surface (the surface on which epitaxial growth is ultimately to occur) to be at an elevated temperature which is nevertheless lower than that of the remainder of the substrate. This will cause the disadvantageous factors to travel or migrate through the substrate body from the warmer portion to the cooler portion.

We have found that this is most advantageously accomplished in connection with the fabrication of devices of the type under discussion by controlling not only the degree of heating of different portions of the substrate but also the rate of heating and cooling those portions. A particularly effective commercial sequence of parameters comprises the following: A furnace is loaded with between 100 and 200 individual substrates supported over one-half their diameter or less and with a wafer spacing of approximately 175 mils. In order to maintain the operative surface at the desired temperature lower than the body of the substrate a cooling gas is caused to fill the furnace and pass over the exposed operating surfaces of the substrates, that gas preferably at least originally comprising nitrogen flowing at the rate of approximately 12 standard liters per minute and oxygen flowing at the rate of approximately 2 standard liters per minute. This flow of gas into the furnace is first carried out for a period of time such as 10 minutes to purge the furnace of other gases and is then continued, preferably as described below. The first step of the preferred annealing process involves ramping the temperature of the furnace to approximately 1150° C. at a rate of about 5° per minute and maintaining that 1150° C. temperature for about 120 minutes. We have observed that in the devices that we have made according to this method any substantially greater rate of rise of temperature will damage the devices.

At the end of that 120 minutes the furnace temperature is ramped down to approximately 950° C. at the rate of approximately 4° per minute, which rate may well vary by 0.5° per minutes in either direction, and the 950° C. temperature is maintained for a period of about 180 minutes. Thereafter the furnace temperature is ramped to about 700° C. at a rate of about 2° per minute, which rate may well vary by about 0.5° per minute in either direction.

During all of the preceding steps both nitrogen and oxygen preferably have been flowing into the furnace as described and cooling the exposed substrate surfaces. At this point, however, the oxygen flow is preferably terminated while the nitrogen flow continues, the furnace atmosphere becomes substantially 100% nitrogen, and the furnace is then cooled to approximately room temperature at a rate of approximately 10° per minute, which rate may well vary by 1° per minute in either direction.

The presence of oxygen in the furnace during a good portion of the annealing process results in the growth of an oxide layer on the operative surface. That oxide is preferably next removed by subjecting it to a bath of a mixture of buffered hydrofluoric acid, nitric acid and deionized water. Some of the disadvantageous factors will be present in that oxide layer, and they are thus removed.

Next, the operative surface of the substrate is subjected to a further grinding operation by a fine grinding wheel (6 micron grit). This grinding step, which removes material at the rate of approximately 1 micron per second, is caused to remove approximately 10 microns of thickness of silicon. It is preferred that the grinding wheel speed be 4500 rpm and that the substrate be rotated at the rate of approximately 750 rpm in a direction opposite to that of the grinding wheel. The grinding wheel preferably should dwell at its final position for a period of about 20–30 seconds. The substrate is then subjected to a high pressure rinsing step at 1000 psi, using a surfactant and deionized water.

At this point at least a substantial proportion of the disadvantageous factors have been removed from, and hence are no longer present in, the substrate, thus ensuring that the finished device of the type under discussion will have satisfactory, and in most cases optimum, functioning characteristics. In this way the objectives of the present invention are realized.

The substrate is now ready for the continuance of the method disclosed in the '509 patent, beginning with the "final cleaning" step specified at line 33 of column 2 of the specification of that patent. It is preferred that the SC1 and SC2 washes be performed in a megasonic cleaning station, followed by a slow pull drying technique to reduce surface particles.

At the beginning of the epitaxial growth step a thick susceptor coating is grown to maximize backside sealing and reduce outgassing from the substrate. The pre-epitaxial deposition etch consists of a 10 minute high rate 90% hydrochloric acid gas flow followed by a 10 minute 50% hydrochloric acid gas flow at a temperature of 1140° C., the etch removing 7 microns of thickness of silicon.

Semiconductor devices of the type here under discussion, when processed as described above and fabricated into devices, are equivalent in quality, yield and performance to devices formed by industry standard methods. However, the manufactured cost of the devices under discussion made according to the present invention are significantly less than the manufactured cost of such devices made in conventional fashion.

While only a single embodiment of the present invention has been here specifically disclosed, corresponding to the best mode known to the inventors at this time, it will be apparent that many variations may be made therein, all within the scope of the invention as defined in the following claims.

We claim:

1. The method of fabricating semiconductor devices on a substrate having a surface on which epitaxial growth is to occur which comprises:

(1) subjecting said surface of said substrate to a first grinding;

(2) cleaning the resulting surface without polishing said surface;

(3) subjecting the resulting substrate to an annealing process in which the body of said substrate other than said surface is heated to an elevated temperature while said substrate surface is maintained at a lower temperature, thereby to move disadvantageous factors within said substrate into a space substantially at said surface;

(4) substantially removing the resulting substrate space from said substrate by a process comprising subjecting said surface to a second grinding;

(5) cleaning the resulting surface;

(6) gas etching away the resulting surface; and (7) subjecting the resulting surface to chemical vapor deposition, thereby epitaxially growing a doped layer on the resulting surface.

2. The method of claim 1, in which said step (3) involves subjecting the said body of said substrate to a temperature of about 1150° C. or higher.

3. The method of claim 1, in which step (4) also comprises chemically substantially removing surface oxide, if present, from said surface.

4. The method of claim 1, in which said grinding of step (4) is carried out to a depth of up to about 10 microns.

5. The method of claim 1, in which, in step (3), the body of said substrate is heated to a temperature of about 1150° C., is maintained at that temperature for a period of time, and is then cooled.

6. The method of claim 5, in which said surface is maintained at a temperature lower than that of the body of said substrate by causing a mixture of oxygen and nitrogen to flow over said surface for at least a portion of the time that the body of said substrate is at an elevated temperature.

7. The method of claim 1, in which, in step (3), the body of said substrate is heated to a temperature of about 1150° C. at a rate of about 5° per minute or less, is maintained at that temperature for about 120 minutes, and is then cooled.

8. The method of claim 7, in which said surface is maintained at a temperature lower than the temperature in the body of said substrate by causing a mixture of oxygen and nitrogen to flow over said surface for at least a portion of the time that the body of said substrate is at an elevated temperature.

9. The method of claim 1, in which, in step (3), the body of said substrate is gradually heated to a temperature of about 1150° C. at a rate of about 5° per minute or less, is maintained at that temperature for about 120 minutes, is then gradually cooled at a rate of about 4° per minute to a temperature of about 900° C., is maintained at that temperature for about 180 minutes, and is then cooled to room temperature.

10. The method of claim 9, in which said surface is maintained at a temperature lower than that of the body of said substrate by causing a mixture of oxygen and nitrogen to flow over said surface for at least a portion of the time that the body of said substrate is at an elevated temperature.

11. The method of claim 1, in which, in step (3), the body of said substrate is heated to a temperature of about 1150° C. at a rate of about 5° per minute or less, is maintained at that temperature for about 120 minutes, and is then cooled at a rate of about 4° per minute to a temperature of about 950° C., is maintained at that temperature for about 180 minutes, is then cooled to about 700° C. at a rate of about 2° per minute, and is then cooled to room temperature at a rate of about 10° per minute.

12. The method of claim 11, in which said surface is maintained at a temperature lower than that of the body of said substrate by causing a mixture of oxygen and nitrogen to flow over said surface for at least a portion of the time that the body of said substrate is at an elevated temperature.

13. The method of claim 11, in which said surface is maintained at a temperature lower than the temperature in the body of said substrate by causing a mixture of oxygen and nitrogen to flow over said surface, the flow of oxygen to said surface being terminated during the time that the substrate cools from about 700° C. to room temperature while the flow of nitrogen continues.

14. The method of claim 1, in which the grinding of step (4) comprises removing material by a grinding element at a rate of about 1 micron per second to a depth of about 10 microns.

15. The method of claim 14, in which the grinding element is rotated at about 4500 rpm.

16. The method of claim 14, in which the grinding element is rotated at about 4500 rpm and the grinding element is caused to dwell at its final grinding position for about 20–30 seconds.

17. The method of claim 14, in which the grinding element is rotated at about 4500 rpm while said substrate is rotated in the opposite direction at about 750 rpm.

18. The method of claim 14, in which the grinding element is rotated at about 4500 rpm while said substrate is rotated in the opposite direction at about 750 rpm and said grinding element is caused to dwell at its final grinding position for about 20–30 seconds.

19. The method of claim 1, in which in carrying out step (3) a layer of oxide is formed at said surface and in which step (4) comprises chemically substantially removing said oxide before performing said grinding process.

* * * * *